SEMICONDUCTOR STABILIZING APPARATUS
Filed Dec. 24, 1956
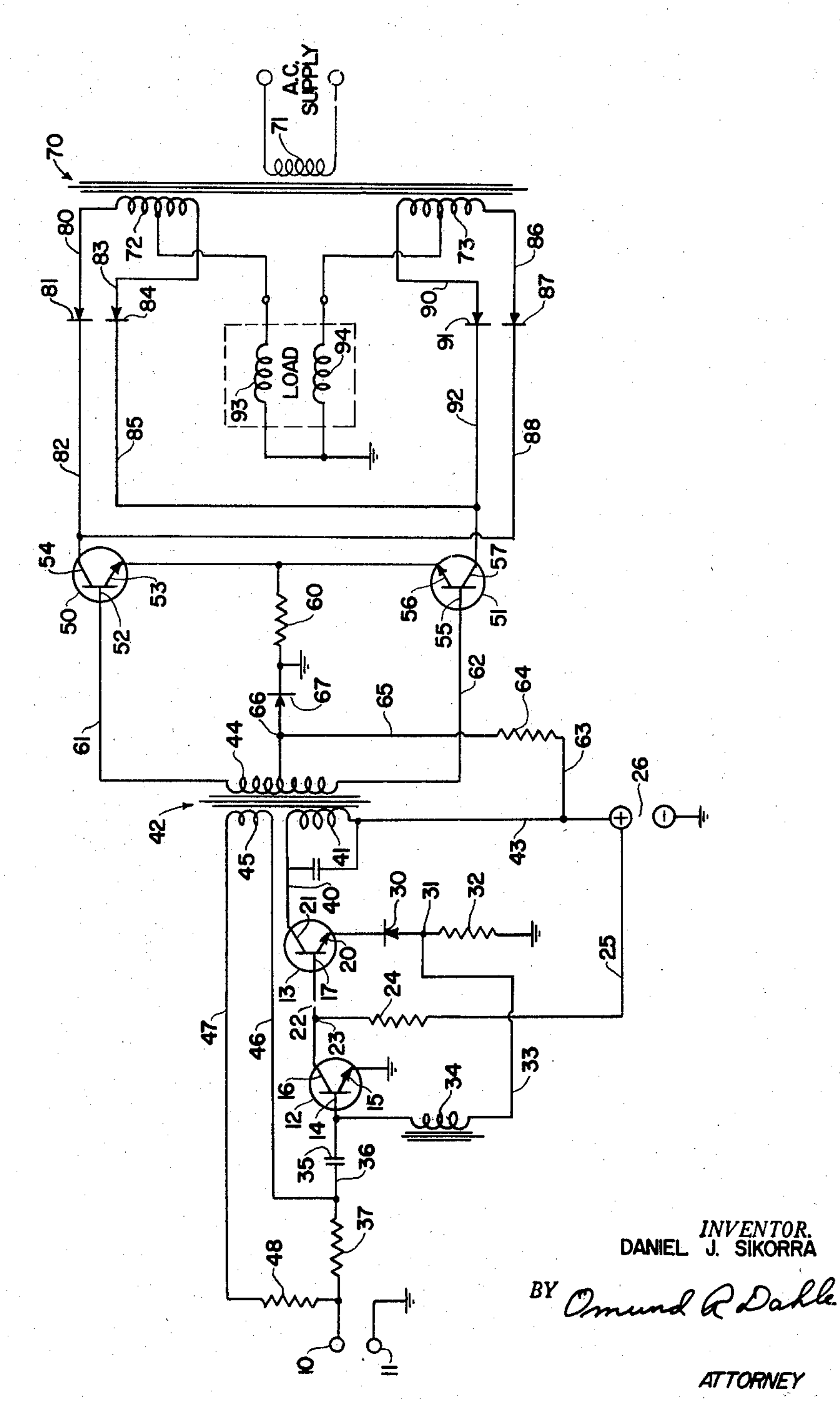
INVENTOR.
DANIEL J. SIKORRA
BY Omund R Dahle
ATTORNEY United States Patent Office 2,874,236
Patented Feb. 17, 1959

2,874,236

SEMICONDUCTOR STABILIZING APPARATUS

Daniel J. Sikorra, Champlin, Minn., assignor to Minneapolis-Honeywell Regulator Company, Minneapolis, Minn., a corporation of Delaware Application December 24, 1956, Serial No. 630,104

11 Claims. (Cl. 179—171)

This invention relates to an improved stabilized semiconductor amplifier circuit which has an improved and novel arrangement for increasing the stabilization of the apparatus over extended temperature ranges. The semiconductor amplifier is a multistage direct coupled amplifier for amplifying an A. C. signal having a new and improved direct current feedback circuit from the output of the amplifier to the input. The feedback circuit comprises an inductance which provides a low resistance feedback path, which allows the D. C. amplification of the circuit to approach unity, whereby the D. C. stability of the amplifier is maintained, and presents a very high impedance to the A. C. signals to be amplified, thus eliminating any A. C. signal feedback so that the A. C. gain of the amplifier is not adversely affected. In addition to the temperature stabilization previously mentioned, my invention provides for mass reproducibility of the amplifier and amplifier operating characteristics although the circuit components are not identical from one amplifier to another.

It has been proposed in the prior patent art to provide a direct coupled semiconductor amplifier circuit comprising a first and a second transistor connected in the common emitter configuration in which the collector electrode of the first transistor is directly coupled to the base electrode of the second transistor; the emitter of the second transistor has a pair of resistors connected in series to the source of energizing potential; and a feedback resistor connects the junction of the two resistors with the base electrode of the first transistor. In order to provide D. C. stabilizing feedback without also having A. C. feedback, the emitter of the second transistor and the junction of the resistors have large bypass capacitors to ground to remove the A. C. signal components from the emitter circuit. The above described circuit has several practical disadvantages which leave much to be desired. One of the principal disadvantages is that the feedback resistor connected between the base of the first transistor and the junction of the resistors in the emitter circuit is of a value which is a compromise at best. On the one hand it should be as small as possible to increase the D. C. stability of the amplifier, and on the other hand, it must be large with respect to the input impedance of the first transistor to prevent the signal supplied to the amplifier input from being shunted by the feedback resistor. The two requirements are not compatable.

In my invention there is provided a novel feedback circuit which overcomes the disadvantages of the prior art. An inductive element is used in the D. C. feedback connection which presents an extremely high impedance to the A. C. signals while the D. C. resistance may be very low and is limited only by the design of the inductance element. In addition, my invention provides a much simpler circuit than the prior art in that my circuit does not require filter capacitors which are bulky and costly, and which present phase shift problems.

It is an object of this invention to provide an improved direct coupled semi-conductor amplifier circuit for amplifying A. C. signals having improved D. C. stability characteristics over extended temperature operating ranges.

It is a further object of this invention to provide a multistage semiconductor amplifier circuit of a new and novel design which has improved stability characteristics.

These and other objects of the present invention will be understood upon consideration of the accompanying specifications, claims, and drawings of which the single figure of the drawing is a schematic circuit diagram of an embodiment of the invention.

Referring now to the drawing, there is disclosed a multistage semiconductor amplifier and discriminator circuit having a pair of input terminals 10 and 11. The signal input terminals are adapted to be connected to any suitable source of signal potential for controlling the amplifier, the amplifier comprising a pair of semiconductive amplifying devices 12 and 13. The semiconductor amplifying devices are shown as junction transistors of the NPN type, transistor 12 having a base electrode 14, an emitter electrode 15, and a collector electrode 16, and transistor 13 having a base electrode 17, an emitter electrode 20, and a collector electrode 21. The collector electrode 16 is directly connected to the base electrode 17 by a conductor 22. A junction 23 on the conductor 22 is connected by means of a resistor 24 and a conductor 25 to a source of potential 26. The emitter electrode 15 of transistor 12 is directly connected to ground. The emitter 20 of transistor 13 is connected to ground through means for providing a potential of a selected value 30, here shown as a Zener diode, a junction 31, and a resistor 32. The junction 31 in the emitter circuit of transistor 13 is connected by a conductor 33 and an inductance 34 to the base electrode 14 of transistor 12. The base electrode 14 is also connected by a capacitor 35, a conductor 36 and a resistor 37 to the input terminal 10. Input terminal 11 may be directly connected to ground. The collector electrode 21 is connected to the source of potential 26 by a conductor 40, a primary winding 41 of a transformer 42, and a conductor 43. The coupling transformer 42 also includes a center tapped secondary winding 44 and a feedback secondary winding 45. The feedback winding 45 is connected across the input resistor 37 by conductors 46 and 47. A resistor 48 is connected in series with the conductor 47.

The secondary winding 44 of the coupling transformer 42 is connected to a full wave demodulator type circuit comprising a pair of semiconductor amplifying devices 50 and 51, here shown as junction transistors of the NPN type. Transistor 50 has a base electrode 52, an emitter electrode 53 and a collector electrode 54, and transistor 51 has a base electrode 55, and emitter electrode 56 and a collector electrode 57. The emitter electrodes 53 and 56 are connected to ground by a single emitter resistor 60. The base electrode 52 is connected by a conductor 61 to the upper terminal of the secondary winding 44 of transformer 42. The base electrode 55 is connected by a conductor 62 to the lower terminal of the winding 44. A base bias is established for the transistors 50 and 51 by a series circuit connected between the source 26 and ground including a conductor 63, a resistor 64, a conductor 65, a junction 66, and a silicon junction diode 67 which has one of its terminals connected to ground. The junction 66 between the resistor 64 and the diode 67 is connected directly to the center tap of the secondary winding 44. The demodulator circuit also includes a power transformer 70 having a primary winding 71 connected to a suitable source of alternating current power, and having a plurality of center tapped secondary windings 72 and 73. The center tap terminals of secondary windings 72 and 73 are connected through load devices 93 and 94 respectively to ground. The upper terminal of winding 72 is connected by a conductor 80, a junction diode 81, and a conductor 82 to the collector electrode 54 of the transistor 50. The lower terminal of winding 72 is connected by a conductor 83, a diode 84, and a conductor 85 to the collector electrode 57 of the transistor 51. The lower terminal of secondary winding 73 is connected by a conductor 86, a junction diode 87, and a conductor 88 to the collector electrode 54. The upper terminal of winding 74 is connected by a conductor 90, a junction diode 91, and a conductor 92 to the collector electrode 57 of transistor 51.

*Operation*

In considering the operation of the apparatus it will be noted that the two stage direct coupled amplifier circuit is designed to have excellent temperature stability and interchangeability from a D. C. standpoint, while still having substantially no loss in dynamic response. Let us assume that the two transistors 12 and 13, which are connected in the common emitter configuration, are biased so that under quiescent operating conditions both transistors are conducting current to some extent. A current path may be traced for the output circuit of the first stage transistor 12 commencing with the positive terminal of the source 26 and flowing through the conductor 25, the load resistor 24, and the collector to the emitter of transistor 12, the emitter being connected directly to ground to complete the circuit.

The D. C. base current for the transistor 13 also flows through the load resistor 24 from the source 26, and from base to emitter of the transistor 13, through the Zener diode 30, and through the emitter resistor 32 to ground, completing the circuit. The function of the Zener diode is to provide a potential of a selected value at the emitter, and any other suitable potential providing means of low dynamic resistance could be used instead if desired. The output current circuit path of transistor 13 may also be traced from the source 26 through the primary winding 41 of the coupling transformer 42, from collector to emitter of transistor 13, through the Zener diode 30 and through the emitter resistor 32 to ground. The Zener diode acts to provide a relatively constant potential across its terminals to assure proper operating potentials will be available for both transistor 13 and transistor 12, for example, a five volt Zener diode may be used. The quiescent current flowing through the transistor 13 also causes a potential to appear at the junction 31 between the Zener diode and the emitter resistor due to the IR drop across the resistor 32. This potential at the junction 31 provides the bias for the base 14 of the first stage transistor 12 through the inductive element 34, shown as a choke coil. In the stabilizing circuit the inductance element should preferably have a relatively large inductance, for example in one successful embodiment a 140 Henry subminiature choke coil was used.

Let us assume an increase in the ambient temperature accurs causing the second transistor quiescent current to tend to increase. The Zener diode due to its constant voltage characteristics maintains a relatively constant voltage across its terminals, however, the voltage drop across the emitter resistor increases as a result of the current increase so that the junction 31 between the Zener diode 30 and the resistor 32 tends to become more positive. This change in D. C. potential is applied through the inductive element 34 to the base 14 of the first transistor 12 thereby tending to increase the conduction of the first transistor. An increase in the conduction of transistor 12 tends to cause an increase potential drop across the load resistor 24 thereby making the base electrode of the transistor 13 less positive. As the base of transistor 13 becomes less positive the conduction of the transistor 13 is reduced thereby tending to neutralize the increase in current caused by the change in ambient temperature. It is obvious of course that a minute change in the output current of transistor 13 will occur due to varying temperature even with this stabilizing circuit, since some change must occur to initiate the stabilizing action of the circuit. This change is a function of the closed loop gain.

The circuit, as has been described, is extremely D. C. stable because of the feedback effect through the impedance element 34, and this impedance element is also effective to maintain the dynamic A. C. response substantially uneffected. While the D. C. resistance of the coke coil 34 is relatively low, the A. C. impedance of the coil is very high so that substantially none of the A. C. signal can feed forward or feed back through the inductive element.

The input impedance to the amplifier may be increased by connecting the feedback secondary winding 45 from the coupling transformer 42 in series with the input conductors as shown, in one case the input impedance having been raised to in excess of one megohm by suitable design of the feedback winding circuit.

The phase-discriminating demodulator circuit is shown as being connected to two separate load elements 93 and 94, which may be, for example, differential windings of a solenoid or any other suitable load. If desirable a single load may also be used, for example, by changing the load elements as presently shown to resistors and connecting the single load element across the terminals of the resistors which are remote from ground.

The demodulator as shown is full wave and is phase sensitive. The bias potential developed across the silicon junction diode 67 is sufficient to render both transistors 50 and 51 conductive when no signal is present. When a signal is present the conduction of one transistor is increased while the conduction of the other transistor is decreased thereby unbalancing the power delivered to the two respective load devices. The forward voltage drop of the silicon junction diode is a function of temperature, the forward voltage drop decreasing with an increase in ambient temperature so that the bias applied to the two transistors is reduced as the temperature increases, thereby compensating for the increased quiescent collector current present at higher temperatures.

The circuit as disclosed shows the invention applied to two transistors, however, the invention may be utilized in an amplifier having a greater number of stages, if desired. Although modifications of the invention have been tried and will be apparent to those skilled in the art, in one successful embodiment of the invention the following components were used with a signal frequency of 400 C. P. S.:

| Component: | |
|---|---|
| Transistors **12, 13** | Texas Inst. 904. |
| Transistors **50, 51** | Texas Inst. 952. |
| Zener diode **30** | Texas Inst. 651C, 5 volt. |
| Diodes **81, 84, 87, 91** | Raytheon 1N433. |
| Resistor **24** | 30,000 ohms. |
| Resistor **32** | 510 ohms. |
| Resistor **37** | 10,000 ohms. |
| Resistor **48** | 47,000 ohms. |
| Resistor **60** | 22 ohms. |
| Inductance **34** | 140 henry. |
| Capacitor **35** | .25 μfd. |

In general, while I have shown certain specific embodiments of my invention, it is to be understood that this is for the purpose of illustration and that my invention is to be limited solely by the scope of the appended claims.

I claim:

1. Semiconductor apparatus comprising: first and second semiconductor amplifying devices, said semiconductor devices having a plurality of elements including an input element, an output element and a common element; means directly connecting the output element of said first semiconductor device to the input element of said second semiconductor device; a source of electrical power having first and second terminals; first resistive type means connecting the output element of said first device to said first terminal; means directly connecting the common element of said first device to said second terminal; output means connecting the output element of said second semiconductor device to said first terminal; means for providing a potential of a selected value, said means being connected to the common element of said second semiconductor device; second resistive type means connected intermediate said potential providing means and said second terminal; and a direct current feedback path comprising an inductance having a relatively high impedance to alternating currents, said feedback path including no resistance other than that in the inductance itself, connected intermediate the first semiconductor input element and a junction between said potential providing means and said second resistive type means.

2. Direct coupled amplifier apparatus having temperature stability comprising: first and second semiconductor amplifying devices each having a plurality of electrodes including an input electrode, an output electrode, and a common electrode; means connecting the input electrode of said first semiconductor device to a source of alternating type signal of variable magnitude and reversible sense; means directly connecting the output electrode of said first semiconductor device to the input electrode of said second semiconductor device; a source of electrical power having first and second terminals; resistance means connecting the output electrode of said first semiconductor device to said first terminal; means connecting the common electrode of said first device to said second terminal; load means connecting the output electrode of the second semiconductor device to said first terminal; means for providing a potential of a selected value; a resistive element connected to said second terminal, said potential providing means being connected between the resistive element and the common electrode of said second semiconductor amplifying device; and a direct current feedback path comprising an inductance having a relatively high impedance to alternating currents, said feedback path including no resistance other than that in the inductance itself, connected between the input electrode of said first semiconductor device and said resistive element.

3. Stabilized amplifying apparatus comprising: first and second semiconductor amplifying devices, each of said devices having a plurality of electrodes including an input electrode, an output electrode, and a common electrode; a source of electrical power for energizing said amplifier having first and second terminals; output means connecting the output electrode of said second semiconductor device to said first terminal; resistive type means connecting the output electrode of said first semiconductor device to said first terminal; means directly connecting the output electrode of said first semiconductor device to the input electrode of said second semiconductor device in current controlling relation thereto; second resistive means connected to said second terminal; means for providing a potential of a selected value, said means being connected intermediate said resistive means and the common electrode of said second semiconductor device, said semiconductor devices being normally conductive and being subject to variations in conductivity as a function of temperature, thereby varying the potential developed across said resistive means due to said variable conductivity; and a direct current feedback path comprising an inductance having a relatively high impedance to alternating currents, said feedback path including no resistance other than that in the inductance itself, connected from a point between said resistive means and said potential providing means to the input electrode of said first semiconductor device thereby providing a bias circuit for said first semiconductor device, said bias being dependent upon the potential existing across said resistive means.

4. Temperature stabilized direct coupled amplifying apparatus comprising: normally conductive first and second semiconductor amplifying devices, each of said devices having a plurality of electrodes including an input electrode, an output electrode and a common electrode; means connecting the common electrode of said first semiconductor device to a common potential point; a source of potential; resistive means connecting the output electrode of said first semiconductor device to said potential source for energizing said device; means directly connecting the output electrode of said first semiconductor device to the input electrode of said second device in current controlling relation thereto; means connecting the input electrode of said first semiconductor device to a signal source of variable magnitude and reversible phase; output means; means including said output means connected intermediate the output electrode of said second semiconductor device and a source of potential; second resistive means; means connecting said second resistive means to said common potential point and to the common electrode of said second semiconductor device; and a direct current feedback path comprising an inductance having a relatively high impedance to alternating currents, said feedback path including no resistance other than that in the inductance itself, connected between said last named resistive means and said input electrode of said first semiconductor amplifying device.

5. Temperature stabilized direct coupled amplifier apparatus for amplifying alternating current signals comprising: first and second semiconductor amplifying devices, each of said devices having a plurality of electrodes including an input electrode, an output electrode, and a further electrode; means directly connecting the first of said semiconductor devices to the second semiconductor device in current controlling relation thereto; means connecting the input electrode of said first device to an alternating current signal source of variable magnitude and reversible phase; means connecting the output electrode of said second semiconductor device to a source of unidirectional potential; means connecting the output electrode of said first semiconductor device to a source of unidirectional potential, said first and second semiconductor devices being normally conductive and having a tendency for substantial variation of their respective quiescent output currents as a function of operating temperature; resistive means connected to the further electrode of said second semiconductor device and forming a portion of the output circuit whereby the current flowing through said second semiconductor device also flows through said resistive means; and a direct current feedback bias connection comprising an inductive element having a relatively high impedance to alternating signals, said feedback connection including no resistance other than that in the inductive element itself, connected between said resistive means and the input electrode of said first semiconductor device, the bias current to said first semiconductor device being a function of the quiescent output current of said second semiconductor device.

6. Stabilized amplifying apparatus comprising: first and second transistor devices, each of said devices having a plurality of electrodes including a base electrode, a collector electrode, and an emitter electrode; a source of electrical power for energizing said amplifier having first and second terminals; output means connecting the collector electrode of said second transistor device to said first terminal; resistive means connecting the collector electrode of said first transistor device to said first terminal; means directly connecting the collector electrode of said first transistor device to the base electrode of said second transistor device in current controlling relation thereto; second resistive means connected in series with said second terminal; Zener diode means for providing a potential of a selected value, said Zener diode means being connected intermediate said second resistive means and the emitter electrode of said second transistor device, said transistor devices being normally conductive and being subject to variations in conductivity as a function of temperature, thereby varying the potential developed across said resistive means due to said variable conductivity; and a direct current feedback path comprising an inductance element having a relatively high impedance to alternating currents, said feedback path including no resistance other than that in the inductance element itself, connected from a point between said second resistive means and said Zener diode means to the base electrode of said first transistor device thereby providing a bias circuit for said first transistor device, said bias being dependent upon the potential existing across said resistive means.

7. Temperature stabilized direct coupled amplifying apparatus comprising: normally conductive first and second transistors, each of said transistors having a plurality of electrodes including a base electrode, a collector electrode and an emitter electrode; means connecting the emitter electrode of said first transistor to a common potential point; a source of potential; resistive means connecting the collector electrode of said first transistor to said potential source for energizing said transistor; means directly connecting the collector electrode of said first transistor to the base electrode of said second transistor in current controlling relation thereto; means connecting the base electrode of said first transistor to a signal source of variable magnitude and reversible phase; output means; means including said output means connected intermediate the collector electrode of said second transistor and a source of potential; second resistive means; means connecting said second resistive means to the emitter electrode of said second transistor and to said common potential point; and a direct current feedback path comprising an inductance element having a relatively high impedance to alternating currents, said feedback path including no resistance other than that in the inductance element itself, connected between said last named resistive means and said base electrode of said first transistor.

8. Temperature stabilized direct coupled amplifier apparatus for amplifying alternating current signals comprising: first and second transistor means, each of said transistor means having a plurality of electrodes including an emitter electrode, a collector electrode, and a base electrode; means directly connecting the first of said transistor means to the second transistor means in current controlling relation thereto; means connecting the base electrode of said first means to an alternating current signal source of variable magnitude and reversible phase; means connecting the collector electrode of said second transistor means to a source of unidirectional potential; means connecting the collector electrode of said first transistor means to a source of unidirectional potential, said first and second transistor means being normally conductive and having a tendency for substantial variation of their respective quiescent output currents as a function of operating temperature; resistive means connected to the emitter electrode of said second transistor means and forming a portion of the output circuit, whereby the current flowing through said second transistor means also flows through said resistive means; and a direct current feedback bias connection comprising an inductive element having a high impedance to alternating signals, said feedback connection including no resistance other than that in the inductive element itself, connected between said resistive means and the base electrode of said first transistor means, the bias current to said first transistor means being a function of the quiescent output current of said second transistor means.

9. Direct coupled amplifier apparatus having temperature stability comprising: first and second transistor devices each having a plurality of electrodes including a base electrode, a collector electrode, and an emitter electrode; means connecting the base electrode of said first transistor device to a source of alternating type signal of variable magnitude and reversible phase; means directly connecting the collector electrode of said first transistor device to the base electrode of said second transistor device; a source of potential having first and second terminals; resistance means connecting the collector electrode of said first transistor device to said first terminal; means connecting the emitter electrode of said first device to said second terminal; load means connecting the output of the second transistor device to said first terminal; Zener diode means for providing a potential of a selected value; a resistive element connected in series with said second terminal; said Zener diode means being connected between the resistive element and the emitter electrode of said second transistor amplifying device; and a direct current feedback path comprising an inductance element having a relatively high impedance to alternating currents, said feedback path including no resistance other than that in the inductance element itself, connected between the base electrode of said first transistor device and said resistive element.

10. Stabilized semiconductor amplifying apparatus comprising: a plurality of semiconductor amplifying devices, said semiconductor devices each having a plurality of elements including an input element, an output element and a common element; a source of electrical power having first and second terminals; first resistive means connecting the output element of a first of said semiconductor devices to said first terminal; means directly connecting the common element of said first semiconductor device to said second terminal; output means connecting the output element of a second of said semiconductor devices to said first terminal; direct current coupling means connecting the output element of said first semiconductor device to the input element of said second semiconductor device in current controlling relation thereto; means for providing a potential of a selected value, said means being connected to the common element of said second semiconductor device; second resistive means connected intermediate said potential providing means and said second terminal; and a direct current feedback path comprising an inductance element having a relatively high impedance to alternating currents, said feedback path including no resistance other than that in the inductance element itself, connected intermediate the input element of said first semiconductor and a junction between said potential providing means and said second resistive means.

11. Stabilized direct coupled amplifying apparatus comprising: a plurality of semiconductor amplifying devices, each of said devices having a plurality of electrodes including an input electrode, an output electrode, and a common electrode, said input electrode and said common electrode of each semiconductor device comprising an input circuit and said output electrode and said common electrode comprising an output circuit; means connecting the common electrode of a first of said semiconductor devices to a common potential point; a source of potential; resistive means connecting the output electrode of said first semiconductor device to said potential source for energizing said device; direct current coupling means connecting the output electrode of said first semiconductor device to the input electrode of a second of said semiconductor devices in current controlling relation thereto; means connecting the input circuit of said first semiconductor device to a signal source of variable magnitude and reversible phase; output means; means including said output means connected intermedite the output electrode of said second semi-conductor device and as source of potential; second resistive means; means connecting said second resistive means to said common potential point and to the common electrode of said second semiconductor device; and a direct current feedback path comprising an inductance element having a relatively high impedance to alternating currents, said feedback path including no resistance other than that in the inductance element itself, connected between said last named resistive means and said input circuit of said first semiconductor amplifying device.

References Cited in the file of this patent

UNITED STATES PATENTS

| | | |
|---|---|---|
| 2,750,456 | Waldhauer | June 12, 1956 |
| 2,762,875 | Fischer | Sept. 11, 1956 |